United States Patent
Li et al.

(10) Patent No.: US 11,721,887 B2
(45) Date of Patent: Aug. 8, 2023

(54) MILLIMETER WAVE ANTENNA AND METHOD OF MANUFACTURING THE SAME

(71) Applicant: SHENZHEN JAGUAR WAVE TECHNOLOGY LTD., Shenzhen (CN)

(72) Inventors: Haibo Li, Shenzhen (CN); Wei Shin Tung, Shenzhen (CN)

(73) Assignee: SHENZHEN JAGUAR WAVE TECHNOLOGY LTD., Shenzhen (CN)

(*) Notice: Subject to any disclaimer, the term of this patent is extended or adjusted under 35 U.S.C. 154(b) by 354 days.

(21) Appl. No.: 16/996,912

(22) Filed: Aug. 19, 2020

(65) Prior Publication Data

US 2021/0135346 A1 May 6, 2021

(30) Foreign Application Priority Data

Oct. 30, 2019 (CN) .......................... 201911044494.2

(51) Int. Cl.
*H01Q 1/38* (2006.01)
*H01Q 1/12* (2006.01)
(Continued)

(52) U.S. Cl.
CPC ................. *H01Q 1/38* (2013.01); *H01Q 1/12* (2013.01); *H01Q 1/48* (2013.01); *H05K 1/0243* (2013.01);
(Continued)

(58) Field of Classification Search
CPC ................. H01Q 1/12; H01Q 1/22–24; H01Q 1/38–52; H05K 3/4697; H05K 2201/09036
See application file for complete search history.

(56) References Cited

U.S. PATENT DOCUMENTS 8,018,384 B2 * 9/2011 Floyd .................. H01Q 21/065
343/795
2006/0250308 A1 * 11/2006 Pinel .................. H01Q 21/0006
333/204
(Continued)

FOREIGN PATENT DOCUMENTS

CN 105762138 A 7/2016
CN 109478710 A 3/2019
(Continued)

OTHER PUBLICATIONS

Chinese Second Office Action, Chinese Application No. 201911044494.
2, dated Mar. 12, 2021 (13 pages).
(Continued)

*Primary Examiner* — Hasan Islam

(57) ABSTRACT

A millimeter wave antenna and a process design of a millimeter wave antenna are provided. The millimeter wave antenna includes a substrate and an antenna attached to the substrate. The substrate includes a first region and a second region. A thickness of the first region is less than a thickness of the second region. The antenna is arranged on the first region. According to the present application, the millimeter wave antenna enables the substrate attached with the antenna to be as thin as possible, such that a medium structure of the first region of the substrate is changed, reducing an energy loss while a millimeter wave is being transmitted.

8 Claims, 3 Drawing Sheets

(51) Int. Cl.
*H01Q 1/48* (2006.01)
*H05K 1/02* (2006.01)
*H05K 3/46* (2006.01)

(52) U.S. Cl.
CPC ......... *H05K 3/4611* (2013.01); *H05K 3/4697* (2013.01); *H05K 2201/041* (2013.01); *H05K 2201/09036* (2013.01)

(56) References Cited

U.S. PATENT DOCUMENTS

2017/0213794 A1* 7/2017 Baek ..................... H01L 21/56
2020/0161766 A1* 5/2020 Liu ....................... H01Q 9/045

FOREIGN PATENT DOCUMENTS

| CN | 109687117 A | 4/2019 |
| EP | 0858126 A2 | 8/1998 |
| EP | 1063723 A1 | 12/2000 |

OTHER PUBLICATIONS

Chinese First Office Action, Chinese Application No. 201911044494.2, dated Aug. 19, 2020 (14 pages).

\* cited by examiner

MILLIMETER WAVE ANTENNA AND METHOD OF MANUFACTURING THE SAME

CROSS REFERENCE TO RELATED APPLICATIONS

The present application claims foreign priority of Chinese Patent Application No. 201911044494.2, filed on Oct. 30, 2019 in the National Intellectual Property Administration of China, the entire contents of which are hereby incorporated by reference in its entirety.

TECHNICAL FIELD

The present disclosure relates to the field of designing antennas, and in particular to a millimeter wave antenna and a method of manufacturing the millimeter wave antenna.

BACKGROUND

With the advent of the fifth generation (5G) of mobile communication, technologies of the millimeter wave antenna, which serves as one of core technologies of the 5G mobile communication, gets more and more attention and will be applied in various terminals inevitably (such as mobile phones, tablet computers, mobile wearable devices, and the like). To guarantee certain performance, it may be an inevitable trend to provide the antenna having a reduced energy loss as much as possible while the millimeter wave is being transmitted. Therefore, it may be required to provide a millimeter wave antenna plate, which has a low manufacturing cost and is able to avoid the energy loss of the millimeter wave while the millimeter wave is being transmitted, to solve a technical problem of the millimeter wave antenna plate in the related art having a high manufacturing cost and having a high energy loss while the millimeter wave is being transmitted.

SUMMARY OF THE DISCLOSURE

According to a first aspect of the present disclosure, a millimeter wave antenna is provided and includes: a substrate and an antenna attached to the substrate. The substrate includes a first region and a second region. A thickness of the first region is less than a thickness of the second region. The antenna is arranged on the first region.

According to a second aspect of the present disclosure, a method of manufacturing a millimeter wave antenna is provided and includes: providing a substrate, wherein the substrate is attached with an antenna; and defining a hollowed region in the substrate, such that the substrate comprises a first region and a second region. A thickness of the first region of the substrate is less than thickness of the second region of the substrate, and the antenna is arranged on the first region.

According to a third aspect of the present disclosure, a millimeter wave antenna is provided and includes a first substrate; a second substrate adhered to the first substrate; and an antenna arranged on the first substrate. The antenna and the second substrate are arranged on two opposite sides of the first substrate, and an orthographic projection of the antenna on the first substrate is not overlapped with an orthographic projection of the second substrate on the first substrate.

BRIEF DESCRIPTION OF THE DRAWINGS

In order to illustrate technical solutions of embodiments of the present disclosure more clearly, drawings required for illustrating the embodiments will be described in brief. Obviously, the following drawings illustrate only some embodiments of the present disclosure, and to any one of skill in the related art, other drawings may be obtained based on the following drawings without any creative work.

DETAILED DESCRIPTION

Figure 1:
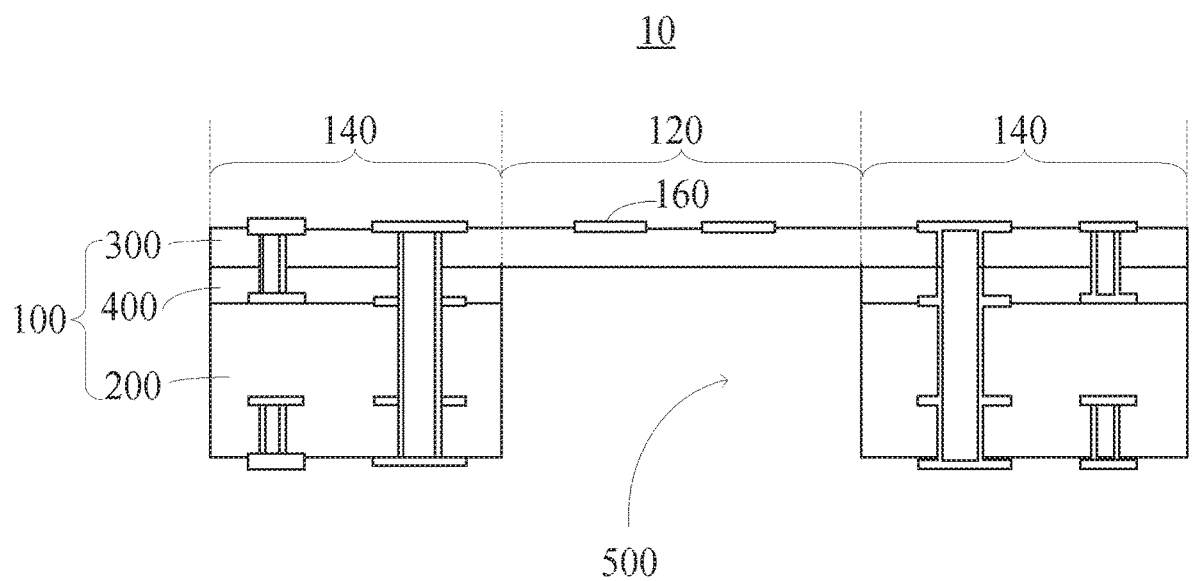
FIG. 1 is a cross-sectional view of a millimeter wave antenna according to an embodiment of the present disclosure.

Technical solutions of the embodiments of the present disclosure will be illustrated clearly and comprehensively by referring to the drawings of the embodiments of the present disclosure. Obviously, the illustrated embodiments are only a part, but not all, of the embodiments of the present disclosure. Based on the embodiments of the present disclosure, any one of skills in the art shall obtain other embodiments without making any creative work, and the other embodiments should be within the scope of the present disclosure.

To be noted that, any directional indication (such as top, bottom, left, right, front, back, and the like) in the embodiments of the present disclosure may be interpreted to indicate a relative positional relation between various components and motion states of the various components in a particular state (such as a state shown in a figure). When the particular state is changed, the directional indication may be changed correspondingly.

In addition, descriptions of "first", "second", and the like involved in the present disclosure are for the purpose of illustration only, and shall not be interpreted as indicating or implying relative significance of a component, or implicitly indicating the number of a technical feature. Therefore, a feature defined by the "first" or the "second" may indicate or imply that at least one feature is included. Further, technical solutions of various embodiments may be combined, but it is necessary for an ordinary skilled person in the art to achieve the combination. When the technical solutions to be combined conflict with each other, or when combination is unable to be achieved, the combination of the technical solutions should be seen as non-existed and is not included in the scope of the present disclosure.

As shown in FIG. 1, the present disclosure may provide a millimeter wave 10, including a substrate 100. The substrate 100 includes a first portion 120 and a second portion 140.

A thickness of the first portion 120 may be less than a thickness of the second portion 140. An antenna 160 may be arranged on the substrate 100 and may be arranged on the first portion 120.

A flex-rigid plate may be applied in the millimeter wave antenna 10. A side of the first portion 120 opposite to the antenna 160 may be recessed, such that a hollow region 500 is defined by the first portion 120 and the second portion 140. The thickness of the first portion 120 attached with the antenna 160 may be arranged to assure depth tolerance of the hollow region 500 of the first portion attached with the antenna 160 and assure flatness of a surface of the side of the first portion 120 opposite to the antenna 160. That is, a value of Df may be reduced, and an energy loss while the antenna 160 is transmitting a millimeter wave may be reduced. Further, defining the hollow region 500 in the first portion 120 attached with the antenna 160 may guarantee performance of the millimeter wave antenna 10 and reduce a cost of a material of the substrate 100 at the same time.

To be specific, in the present embodiment, the thickness of the first portion 120 of the substrate is less than the thickness of the second portion 140 of the substrate, and the thickness of the first portion 120 of the substrate is sufficient to support the antenna 160 arranged on the first portion 120. The thickness of the first portion 120 of the substrate is as small as possible, and a minimal thickness able to support the attached antenna 160 may be applied. A positional relation between the first portion 120 attached with the antenna 160 and the second portion 140 is shown in FIG. 1. Two second portions 140 may be arranged. The first portion 120 is arranged between the two second portions 140. In another implementation of the present embodiment, two first portions 120 and one second portion 140 may be arranged, and the two first portions 120 may be arranged at two opposite sides of the second region 140. In the present embodiment, the positional relation between the first region 120 and the second region 140 may not be limited.

In the present embodiment, the substrate 100 may be made of a material of FR-4. The FR-4 is also referred as an epoxy glass fiber substrate. An epoxy resin may be used as an adhesive, and an electronic grade glass fiber cloth may serve as an enhancement material. The FR-4 may have a low manufacture cost and high yield practicability. Therefore, FR-4 may be applied as a material of the substrate. The substrate may also be made of other materials, which will not be limited by the present disclosure.

The substrate 100 may include a first FR-4 substrate 200 and a second FR-4 substrate 300. A rigid PP 400 may be configured to adhere the first FR-4 substrate 200 with the second FR-4 substrate 300. The first FR-4 substrate 200 may be arranged with the second portion 140 only, In other words, the first portion 120 may not be arranged with the PP 400, i.e., the PP 400 is not received in the hollow region 500. A position, at which the hollow region 500 is defined, may not be limited by the present disclosure. The hollow region 500 may be defined between the two second portions 140, arranged at two sides of the second region 140, or arranged at a periphery of the second region 140, as long as the hollow region 500 corresponds to the first region 120, i.e., as long as the hollow region 500 is defined by the side of the first portion 120 opposite to the antenna 160 being recessed. The thickness of the first portion 120 of the substrate attached with the antenna 160 may be as small as possible, assuring the depth tolerance of the hollow region 500 and the flatness of the surface of the side of the first portion 120 opposite to the antenna 160. Defining the hollow region 500 may change the medium structure of the first portion 120 of the substrate, such that an energy loss while the antenna 160 on the first portion 120 is transmitting may be reduced.

A thickness of the second FR-4 substrate 300 corresponding to the first portion 120 may be a minimal thickness sufficient to support a weight of the antenna 160, assuring the depth tolerance of the first portion 120 of the substrate attached with the antenna 160 and the flatness of the surface of the side of the first portion opposite to the antenna 160.

The thickness of the second FR-4 substrate 300 may be determined by an ordinary skilled person in the art based on an application scenario of the antenna 160, which will not be limited by the present disclosure.

The rigid PP 400 for adhering the first FR-4 substrate 200 and the second FR-4 substrate 300 may be a rigid adhesive, configured to adhere the first FR-4 substrate 200 with the second FR-4 substrate 300, such that the first FR-4 substrate 200 and the second FR-4 substrate 300 may be adhered to form an integral structure, and performance of the first FR-4 substrate and the second FR-4 substrate may not be impacted. A side of the first FR-4 substrate 200 away from the second FR-4 substrate 300 may be made of a material for connecting to the ground, such as a metal. The skilled person in the art may determine whether to arrange the side of the first FR-4 substrate 200 to connect to the ground based on the performance of the antenna 160 attached to the first portion 120, which will not be limited by the present disclosure.

Figure 2:
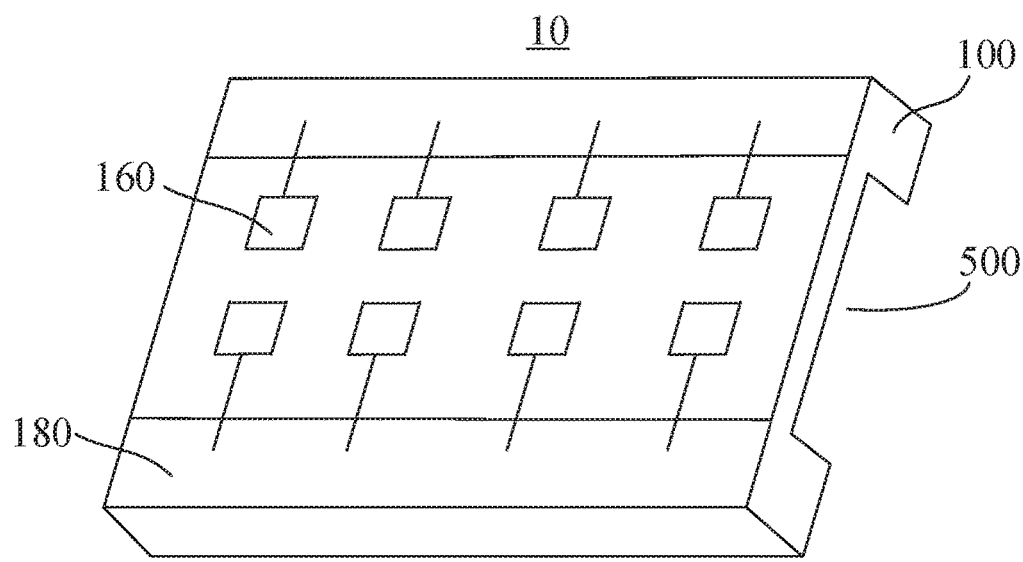
FIG. 2 is a front view of a millimeter wave antenna according to an embodiment of the present disclosure.

As shown in FIG. 2, the antenna 160 attached to the first portion 120 may be an antenna required to connect an additional reference ground, such as a patch antenna. Alternatively, the antenna 160 may be an antenna that is not required to connect to the additional reference ground, such as a Dipole antenna, a Pifa antenna, or a Monopole antenna, and the like. To be specific, a shape of the antenna 160 attached to the first portion 120 may not be limited by the present disclosure. The antenna 160 may be rectangular, rhombus, and the like. For example, two antennas 160 may be rectangular and arranged on the first portion 120. The two antennas 160 may be arranged at two opposite sides or any two sides of the first portion 120. When the two antennas 160 are arranged at two opposite sides, the two antennas 160 may not correspond to each other. The number and arrangement positions of the antennas 160 may not be limited by the present disclosure.

A reference ground 180 may be arranged on the substrate 100. The reference ground 180 may be arranged in the second portion 140, and may be connected to the antenna 160 through a feedback route, enabling the antenna 160 to transmit in the substrate.

In the present disclosure, the millimeter wave antenna 10 may include the substrate 100. The substrate 100 may include the first portion 120 and the second portion 140. The thickness of the first portion 120 may be less than the thickness of the second portion 140. The antenna 160 may be arranged on the substrate 100, and may be arranged on the first portion 120. By arranging the thickness of the first portion 120 to be less than the thickness of the second portion 140, the thickness of the first portion 120 of the substrate may be a minimal thickness sufficient to support the weight of the antenna 160, assuring the depth tolerance of the hollow region 500 and the flatness of the surface of the side of the first portion 120 opposite to the antenna 160. Further, the hollow region 500 may be defined by the side of the first portion 120 opposite to the antenna 160 being recessed, changing the medium structure of the first portion 120 of the substrate, reducing a transmission loss of the antenna 160 attached to the first portion 120. At the same time, the substrate 100 may be made of the FR-4 material, which has a low manufacture cost and high yield practicability, reducing a cost of manufacturing the millimeter wave antenna 10.

Figure 3:
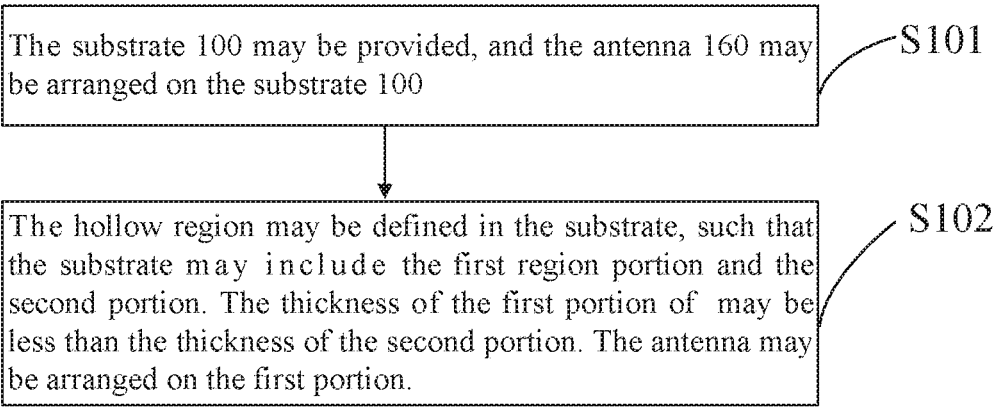
FIG. 3 is a flow chart of a method of manufacturing a millimeter wave antenna according to the present disclosure.
Figure 4:
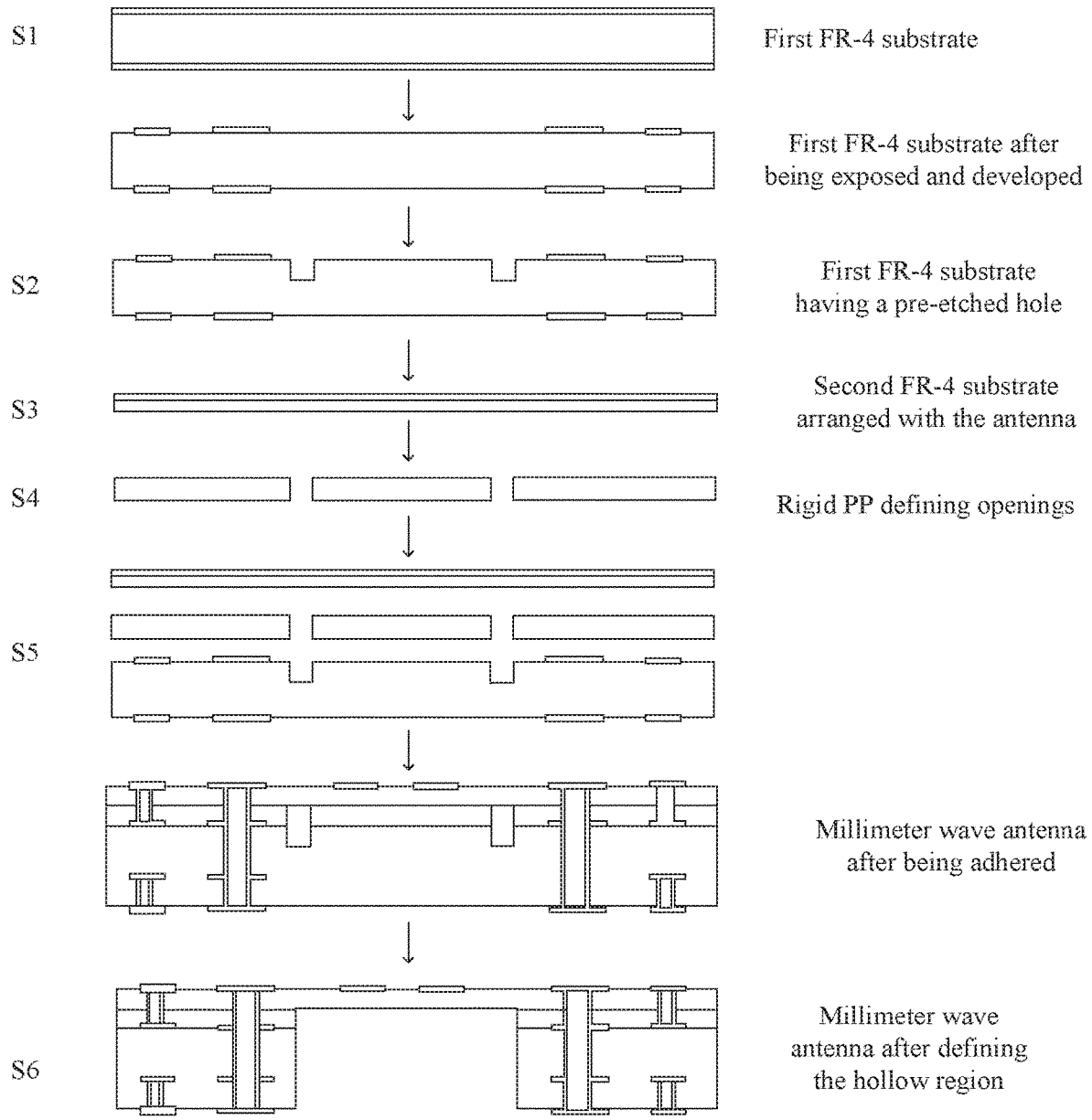
FIG. 4 is a schematic view of manufacturing a millimeter wave antenna according to the present disclosure.

The present disclosure may provide a method of manufacturing the millimeter wave antenna 10 to obtain the above-mentioned millimeter wave antenna 10. In the present embodiment, an antenna, such as dipole antenna, which is not required to connect to the additional reference ground, may be taken as an example. Of course, the antenna may also be the antenna required to connect to the additional reference ground, such as the patch antenna. A type of the antenna will not be limited by the present embodiment, and a skilled person in the art may determine the type of the antenna based on actual application scenarios. As shown in FIG. 3 and FIG. 4, FIG. 3 is allow chart of a method of manufacturing a millimeter wave antenna according to the present disclosure, and FIG. 4 is a schematic view of manufacturing a millimeter wave antenna according to the present disclosure.

The method of manufacturing the millimeter wave antenna may include following operations.

S101, the substrate 100 may be provided, and the antenna 160 may be arranged on the substrate 100.

S102, the hollow region 500 may be defined in the substrate 100, such that the substrate 100 may be arranged to include the first portion 120 and the second portion 140. The thickness of the first portion 120 of the substrate may be less than the thickness of the second portion 140 of the substrate. The antenna 160 may be arranged on the first portion 120.

In an embodiment, the substrate 100 may be made of the material of FR-4. The substrate 100 may include the first FR-4 substrate 200 and the second FR-4 substrate 300. The substrate 100 may be processed to be combination of being flexible and being rigid. The flow chart of obtaining the substrate having the hollow region defined by the side of the first portion 120 attached with the antenna 160 and the second portion 140 may include following operations.

S1, the first FR-4 substrate 200 may be provided.

To be specific, the provided first FR-4 substrate 200 may be coated with a photosensitive film, and the photosensitive film may be exposed and developed. Further, after being developed, the first FR-4 substrate 200 may be etched to obtain a route, and a processed first FR-4 substrate 200 may be obtained.

S2, a pre-etched hole may be defined in the first FR-4 substrate 200.

To be specific, a laser cutting may be performed on the first FR-4 substrate 200 having the route to define the pre-etched hole. The number of the pre-etched hole may be two or more, which will not be limited by the present disclosure. The laser cutting and a laser beam may be arranged to irradiate a surface of the first FR-4 substrate 400, releasing energy to melt or evaporate the material of a portion of the first FR-4 substrate 200 to be cut. In this way, the first FR-4 substrate 200 having the pre-etched hole may be obtained.

S3, the second FR-4 substrate 300 may be provided, and the antenna 160 may be attached to the second FR-4 substrate 300.

To be specific, a portion of the second FR-4 substrate 300 corresponding to the first portion 120 may be attached with at least one antenna 160. The at least one antenna 160 may be arranged at two opposite sides or any two sides of the portion of the second FR-4 substrate 300 corresponding to the first portion 120. When two antennas 160 are arranged at two opposite sides, the two antennas 160 are not required to correspond to each other. The number and arrangement positions of the antennas 160 may not be limited by the present embodiment.

S4, the rigid PP 400 may be processed to define an opening, and the opening may correspond to the pre-etched hole.

To be specific, processing the rigid PP 400 may be performing laser cutting to the rigid PP400. A position and a size of a portion of the rigid PP 400 to be cut may be consistent with the position and the size of the pre-etched hole in the first FR-4 substrate 200. The rigid PP400 may be an adhesive and may be made of a rigid plastic adhesive plate. The rigid PP 400 may be configured to adhere a plurality of printed boards. The material of the rigid PP 400 may not be limited by the present embodiment.

S5, the first FR-4 substrate 200 may be adhered with the second FR-4 substrate 300 through the rigid PP 400.

The first FR-4 substrate 200, the second FR-4 substrate 300, and the rigid PP 400 may be adhered integrally. For example, a partial laminating method of a cover layer may be performed. An outermost cover layer of the substrate 100 may extend into approximately $\frac{1}{10}$ of the substrate 100. The substrate 100 may define the pre-etched hole. The arranged rigid PP 400 without flexibility may have high binding capacity, enabling adhesion of the first FR-4 substrate 200, the second FR-4 substrate, and the rigid PP 400. The millimeter wave antenna 10 after the adhesion may be coated with the photosensitive film, the photosensitive film may be exposed and developed, and the processed millimeter wave antenna 10 may be obtained.

S6, the processed millimeter wave antenna 10 may further be processed to define the hollow region 500.

To be specific, based on the pre-etched hole defined in the first FR-4 substrate in S2, the laser cutting may be performed to define a first opening in the millimeter wave antenna 10 after being processed in S5, and that is the hollow region 500. The hollowed region 500 may be defined in a middle or two opposite sides of the second region 140. A skilled person in the art may determine a position in which the hollow region 500 may be defined based on actual needs, as long as a portion of the first FR-4 substrate defining the hollow region 500 serves as the first portion 120 and is arranged with the antenna 160, and the first portion 120 is able to support the attached antenna 160. The first portion 120 attached with the antenna 160 may be thin sufficiently to change the medium structure of the antenna 160, reducing the energy loss while the antenna 160 is transmitting.

In the present embodiment, the first FR-4 substrate 200 and the second FR-4 substrate 300 may be made of the material of FR-4. The FR-4 may be referred as an epoxy glass fiber plate, taking the epoxy resin as the adhesive and taking the electronic grade glass fiber cloth as the enhancement material. The FR-4 may have a low manufacture cost and have high yield practicability, such that the FR-4 may serve as the material of the substrate.

A side of the first FR-4 substrate 200 away from the second FR-4 substrate 300 may be made of the material for connecting to the ground, such as the metal. A skilled person in the art may determine the material based on the performance of the antenna 160 attached to the first region 120, which will not be limited by the present disclosure.

The reference ground 180 may be attached to the substrate 100, the reference ground 180 may be arranged on the second region 140 and connected to the antenna 160 through the feedback route, such that the antenna 160 may transmit in the substrate.

According to the method of manufacturing the millimeter wave in the present embodiment, the substrate 100 may be provided, and the antenna 160 may be arranged on the substrate 100. The substrate 100 may include the first portion 120 and the second portion 140. The antenna 160 may be arranged on a side of the first portion 120, and another side of the first portion 120 opposite to the side arranged with the antenna 160 may be recessed to define the hollow region 500. In this way, the thickness of the first portion 120 of the substrate is less than the thickness of the second portion 140 of the substrate. Combination of flexibility and rigidity may be performed to the substrate hollow region 500, reducing a size error when assembling the substrate 100, assuring the depth tolerance of the substrate hollow region and the flatness of the surface of the side of the first portion opposite to the antenna. That is, the value of Df may be reduced, and the energy loss while the antenna 160 is transmitting may be reduced. The substrate may be made of the material of FR-4, reducing the manufacture cost of the millimeter wave antenna 10. The thickness of the first portion attached with the antenna 160 may be arranged to be as small as possible, and may be arranged to be the minimal thickness sufficient to support the weight of the antenna 160. In this way, the flatness of the surface of the side of the first portion opposite to the antenna may be assured, and the medium structure of the first portion 120 of the substrate may be changed, reducing the transmission loss of the antenna 160 attached to the first portion 120. Further, the first FR-4 substrate 200 may be pre-cut to define the pre-etched hole, enabling the hollow region to be defined easily after the adhesion and avoiding an uneven surface caused by the conventional drilling technique having reduced accuracy.

The above description illustrates embodiments of the present disclosure only, but does not limit the scope of the present disclosure. Any equivalent structural or process transformation performed based on the description and the drawings, applied directly or indirectly in other related art, should be within the scope of the present disclosure.

What is claimed is:

1. A millimeter wave antenna, comprising:
   a substrate, wherein the substrate comprises a first portion and a second portion, and a thickness of the first portion is less than a thickness of the second portion;
   an antenna arranged on the substrate, wherein the antenna is arranged on the first portion only and is arranged on a first side of the first portion; and
   a reference ground, attached to the substrate and arranged on the second portion only, wherein the reference ground is arranged a second side of the second portion away from the first side of the first portion,
   wherein an orthographic projection of the reference ground onto a plane where the first side of the first portion is located is out of an orthographic projection of the antenna onto the plane where the first side of the first portion is located.

2. The millimeter wave antenna according to claim 1, wherein the thickness of the first portion is a minimal thickness sufficient to support a weight of the antenna.

3. The millimeter wave antenna according to claim 1, wherein the substrate is an FR-4 substrate.

4. The millimeter wave antenna according to claim 3, wherein
   the substrate comprises a first FR-4 substrate and a second FR-4 substrate;
   a rigid adhesive is arranged between the first FR-4 substrate and the second FR-4 substrate, and is arranged to adhere the first FR-4 substrate with the second FR-4 substrate; and
   the first FR-4 substrate defines a hollow region corresponding to the first portion.

5. A method of manufacturing a millimeter wave antenna, comprising:
   providing a substrate, wherein the substrate is arranged with an antenna; and
   defining a hollow region in the substrate, such that the substrate comprises a first portion and a second portion, wherein a thickness of the first portion of the substrate is less than thickness of the second portion of the substrate, and the antenna is arranged on the first portion only and is arranged on a first side of the first portion; and
   a reference ground, attached to the substrate and arranged on the second portion only, wherein the reference ground is arranged a second side of the second portion away from the first side of the first portion,
   wherein an orthographic projection of the reference ground onto a plane where the first side of the first portion is located is out of an orthographic projection of the antenna onto the plane where the first side of the first portion is located.

6. The method according to claim 5, wherein the substrate is made of a material of FR-4.

7. The method according to claim 6, wherein the providing a substrate comprises:
   providing a first FR-4 substrate;
   defining a pre-etched hole in the first FR-4 substrate;
   providing a second FR-4 substrate, wherein the antenna is attached to the second FR-4 substrate;
   adhering the first FR-4 substrate with the second FR-4 substrate; and
   defining the hollowed region in the first FR-4 substrate based on the pre-etched hole, such that the first FR-4 substrate is hollowed, and the hollowed region corresponds to the first region.

8. The method according to claim 7, wherein the adhering the first FR-4 substrate with the second FR-4 substrate comprises:
   defining an opening in a rigid adhesive, wherein the opening corresponds to the pre-etched hole; and
   adhering the first FR-4 substrate with the second FR-4 substrate through the rigid PP.

* * * * *